(12) United States Patent
Japp et al.

(10) Patent No.: US 8,084,863 B2
(45) Date of Patent: Dec. 27, 2011

(54) CIRCUITIZED SUBSTRATE WITH CONTINUOUS THERMOPLASTIC SUPPORT FILM DIELECTRIC LAYERS

(75) Inventors: Robert M. Japp, Vestal, NY (US); Voya R. Markovich, Endwell, NY (US); Kostas I. Papathomas, Endicott, NY (US); Mark D. Poliks, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 68 days.

(21) Appl. No.: 12/081,051

(22) Filed: Apr. 10, 2008

(65) Prior Publication Data
US 2008/0191354 A1 Aug. 14, 2008

Related U.S. Application Data

(63) Continuation-in-part of application No. 11/086,323, filed on Mar. 23, 2005, now Pat. No. 7,470,990.

(51) Int. Cl.
*H01L 23/50* (2006.01)
(52) U.S. Cl. ........ 257/759; 257/758; 257/760; 257/762; 257/E23.069; 438/125; 438/763
(58) Field of Classification Search ............... 257/703, 257/758, 760, 762, 759, 761, E23.069; 438/125, 438/763
See application file for complete search history.

(56) References Cited

U.S. PATENT DOCUMENTS

| | | |
|---|---|---|
| 3,767,756 A | 10/1973 | Blades |
| 3,953,566 A | 4/1976 | Gore |
| 4,729,921 A | 3/1988 | Tokarsky |
| 5,109,107 A * | 4/1992 | Vora et al. ............... 528/350 |
| 5,229,199 A | 7/1993 | Miner et al. |
| 5,246,817 A | 9/1993 | Shipley, Jr. |
| 5,314,742 A | 5/1994 | Kirayoglu et al. |
| 5,418,689 A | 5/1995 | Alpaugh et al. |
| 5,652,055 A | 7/1997 | King et al. |
| 6,160,078 A * | 12/2000 | Osada et al. ............... 528/104 |
| 6,192,581 B1 * | 2/2001 | Tsukamoto ............... 29/852 |
| 6,207,595 B1 | 3/2001 | Appelt et al. |
| 6,323,436 B1 * | 11/2001 | Hedrick et al. ............... 174/256 |
| 6,358,608 B1 | 3/2002 | Hanyon et al. |
| 6,495,244 B1 * | 12/2002 | Andresakis et al. ......... 428/209 |
| 6,534,179 B2 * | 3/2003 | Japp et al. ............... 428/413 |
| 6,900,269 B2 * | 5/2005 | Hwang et al. ............... 525/109 |
| 7,078,816 B2 | 7/2006 | Japp et al. |
| 7,145,221 B2 | 12/2006 | Memis et al. |
| 7,270,845 B2 | 9/2007 | Japp et al. |
| 2003/0044588 A1 * | 3/2003 | Komoto et al. ............... 428/209 |

* cited by examiner

*Primary Examiner* — Thinh T Nguyen
(74) *Attorney, Agent, or Firm* — Mark Levy; Lawrence R. Fraley; Hinman, Howard & Kattell

(57) ABSTRACT

A circuitized substrate including a dielectric layer having a p-aramid paper impregnated with a halogen-free, low moisture absorptivity resin and not including continuous or semi-continuous fiberglass fibers as part thereof, and a first circuitized layer positioned on the dielectric layer. A method of making this substrate is also provided.

13 Claims, 3 Drawing Sheets

CIRCUITIZED SUBSTRATE WITH CONTINUOUS THERMOPLASTIC SUPPORT FILM DIELECTRIC LAYERS

The present invention is a continuation-in-part application of Ser. No. 11/086,323 now U.S. Pat. No. 7,470,990. All of the above applications are assigned to the same Assignee as the present invention.

TECHNICAL FIELD

This invention relates to circuitized substrates such as printed circuit boards (hereinafter also referred to simply as PCBs) and chip carriers and to processes for manufacturing same.

CROSS REFERENCE TO CO-PENDING APPLICATIONS

In Ser. No. 11/896,786, filed Sep. 6, 2007, there is defined a circuitized substrate which includes at least one circuit layer and at least one substantially solid dielectric layer comprised of a dielectric composition which includes a cured resin material and a predetermined percentage by weight of particulate fillers, but not including continuous or semi-continuous fibers as part thereof. Ser. No. 11/896,786 is a divisional application of Ser. No. 10/812,889, which is now U.S. Pat. No. 7,078,816 (see below).

In Ser. No. 11/086,323, filed Mar. 23, 2005, there is defined a circuitized substrate including a composite layer having a first dielectric sub-layer including a plurality of fibers having a low coefficient of thermal expansion and a second dielectric sub-layer of a low moisture absorptivity resin, the second dielectric sub-layer not including continuous or semi-continuous fibers or the like as part thereof. The substrate further includes at least one electrically conductive layer as part thereof.

In Ser. No. 12/081,042, filed concurrently herewith, there is defined a multilayered circuitized substrate including a thin core circuitized substrate including a dielectric layer having a p-aramid paper impregnated with a halogen-free, low moisture absorptivity resin and not including continuous or semi-continuous fiberglass fibers as part thereof, and a first circuitized layer positioned on the dielectric layer, in addition to at least one additional dielectric layer, all of these dielectric layers being of the same composition. A method of making this substrate is also provided.

BACKGROUND OF THE INVENTION

PCBs, laminate chip carriers, and the like permit formation of multiple circuits in a minimum volume or space. Such structures typically comprise a stack of layers of signal, ground and/or power planes (lines) separated from each other by a layer of dielectric material. The lines on one plane are often in electrical contact with those on another plane by plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness.

Conventional processes of making PCBs, chip carriers and the like typically comprise fabrication of separate inner-layer circuits (circuitized layers), which are formed by coating a photosensitive layer or film over a copper layer of a copper clad inner-layer base material. The photosensitive coating is imaged, developed and the exposed copper is etched to form the desired number of conductor lines or other features such as power and ground planes patterns. The photosensitive film is then stripped from the copper, leaving the circuit pattern on the surface of the inner-layer base material. Often, this methodology is referred to as photolithographic processing in the PCB art. Added description is not believed necessary in view of such known teachings.

With an established number of such structures formed, a multilayered stack of these may now be produced by preparing a lay-up of inner-layers, ground planes, power planes, etc., typically separated from each other by a layer of conventional dielectric "pre-preg" material, which usually includes a layer of glass cloth (fiberglass) impregnated with a partially cured material (e.g., a "B-stage" epoxy resin). The outermost (top and bottom) layers of the multilayered "stack" usually comprise copper clad, glass-filled, epoxy planar substrates with the copper cladding comprising the exterior surfaces of the stack. This stack is laminated to form a monolithic structure using heat and pressure to fully cure the B-stage resin. As understood, the resulting stack typically has metal (usually copper) cladding on both of its exterior surfaces. Exterior circuit layers are formed in the copper cladding using procedures similar to the procedures used to form the inner-layer circuits. In a well known such procedure, a photosensitive film is applied to the copper cladding, exposed to patterned activating radiation, and developed. An etchant such as cupric chloride may then be used to remove copper bared by the development of the photosensitive film. Finally, the remaining photosensitive film is removed to provide the exterior circuit layers. Various elements of these outer layers, such as pads, may then be electrically coupled to selected electronic components mounted on the structure, such components including capacitors, resistors, modules, and the like, including even semiconductor chips.

Electrically conductive thru-holes (or "interconnects", as often referred to in the industry) are used to electrically connect individual circuit layers within the structure to each other and/or to the outer surfaces, these thru-holes passing through all or a portion of the "stack". Thru-holes are generally formed prior to the formation of circuits on the exterior surfaces by drilling holes through the stack at appropriate locations. Following several pre-treatment steps, the walls of the holes are typically catalyzed by contact with a plating catalyst and metallized, typically by contact with an electro-less or electrolytic copper plating solution to form conductive pathways between circuit layers. Following formation of the conductive thru-holes, exterior circuits, or outer conductive layers are formed using the above procedure(s).

When the above multilayered substrate has been formed with its multiple conductive circuit layers and alternating dielectric layers, the aforementioned semiconductor chips and/or other electrical components (e.g., resistors, capacitors, and even including chip carriers in the case of multilayered PCBs) are mounted at appropriate locations on the exterior circuit layers of the multilayered structure, typically using solder mount pads to bond the components. These components are usually in electrical contact with the circuits within the structure through the thru-holes, as desired. Such solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and then exposed and developed to yield an array of openings defining the pads. The openings are then coated with solder using processes known to the art, one known process being wave soldering.

As is known in the industry, the relative complexity of various product designs has increased significantly in recent years. Mainframe computer PCBs, for example, may require as many as thirty-six layers of circuitry or more, with the complete structure having a thickness of as much as about 0.250 inch (250 mils). Chip carriers, designed to carry one or more semiconductor chips thereon, also require more conductive layers and more complex circuit designs. These products have been typically designed with about three or five mil wide signal lines and twelve mil diameter thru-holes. For increased circuit densification in many of today's products, however, the industry desires to reduce signal lines to a width of only about two mils or less and thru-hole diameters to two mils or less. The substrate industry also desires to avoid manufacturing problems frequently associated with such more complex products, as is understandable. For example, many current processes utilize inner-layer materials that are glass-reinforced resin or other suitable dielectric material, clad with metal (typically copper) on both surfaces.

Glass-reinforcing material, typically utilizing continuous or semi-continuous strands of fiberglass which extend throughout the width and length of the overall final substrate, is used to contribute strength and rigidity to the final stack. If continuous, these fiberglass strands commonly run the full width (or length) of the structure and include no breaks or other segments as part thereof. Thus, by the term "continuous" as used herein to define fibrous materials is meant a structure such as a woven cloth of lengthy fibers, including fibers which, as stated, typically run the full distance through the structure. By the term "semi-continuous" is meant structures with much shortened length fibers, which are also referred to as "chopped" fibers, such as chopped fiber mats. Such fibrous materials occupy a relatively significant portion of the substrate's total volume, a disadvantage especially when attempting to produce highly dense numbers of thru-holes and very fine line circuitry to meet new, more stringent design requirements. More specifically, when holes are drilled (typically using laser or mechanical drills) to form these needed thru-holes, end segments of the fiberglass fibers may extend into the holes during lamination, and, if so, must be removed prior to metallization. This removal, in turn, creates the need for additional pretreatment steps such as the use of glass etchants to remove the glass fibrils extending into the holes, subsequent rinsing, etc. If the glass is not removed, a loss of continuity might occur in the thru hole internal wall metal deposit. In addition, both continuous and semi-continuous glass fibers add weight and thickness to the overall final structure, yet another disadvantage associated with such fibers. Additionally, since lamination is typically at a temperature above 150° C., the resinous portion of the laminate usually shrinks during cooling to the extent permitted by the rigid copper cladding, which is not the case for the continuous strands of fiberglass or other continuous reinforcing material used. The strands thus take on a larger portion of the substrate's volume following such shrinkage and add further to complexity of manufacture in a high density product. If the copper is etched to form a discontinuous pattern, laminate shrinkage may not be restrained even to the extent above by the copper cladding. Obviously, this problem is exacerbated as feature sizes (line widths and thicknesses, and thru-hole diameters) decrease. Consequently, even further shrinkage may occur. The shrinkage, possibly in part due to the presence of the relatively large volume percentage of continuous or semi-continuous fiberglass strands in the individual layers used to form a final product possessing many such layers, may have an adverse affect on dimensional stability and registration between said layers, adding even more problems for the PCB manufacturer.

Glass fiber presence, especially those of the woven type, also substantially impairs the ability to form high quality, very small thru-holes using a laser, one of the most preferred means to form such thru-holes. Glass cloth has drastically different absorption and heat of ablation properties than typical thermo-set or thermo-plastic matrix resins. In a typical woven glass cloth, for example, the density of glass a laser might encounter can vary from approximately 0% in a window area to approximately fifty percent by volume or even more, especially in an area over a cloth "knuckle". This wide variation in encountered glass density leads to problems obtaining the proper laser power for each thru-hole and may result in wide variations in thru-hole quality, obviously unacceptable by today's very demanding manufacturing standards. Glass fiber presence also often contributes to an electrical failure mode known as CAF growth. CAF (cathodic/anodic filament) growth often results in time dependent electrical shorting failure which occurs when dendritic metal filaments grow along an interface (typically a glass fiber/epoxy resin interface), creating an electrical path between two features which should remain electrically isolated. Whether continuous (like woven cloth) or semi-continuous (like chopped fiber mattes), glass fiber lengths are substantial in comparison to the common distances between isolated internal features, and thus glass fibers can be a significant detractor for PCB insulation resistance reliability. While the use of glass mattes composed of random discontinuous chopped fibers (in comparison to the longer fibers found in continuous structures) can largely abate the problem of inadequate laser drilled thru-hole quality, such mattes still contain fibers with substantial length compared to internal board feature spacing and, in some cases, offer virtually no relief from the problem of this highly undesirable type of growth. Many of today's semiconductor packaging substrates are composed of a inner woven glass cloth construction ranging from about 400 to 800 microns thick and include "build-up" layers atop one or both sides thereof in order to form dense packages. The resulting thick "core" is typically drilled using mechanical drilling and the pitch (hole-to-hole spacing) dimensions are rather large.

To address the glass fiber issue, alternative dielectric materials have been proposed, including, for example, one known as "expanded PTFE", PTFE being the designate for polytetrafluoroethylene. A common example of such material is the well known material Teflon, sold by E. I. DuPont de Nemours and Company. In U.S. Pat. No. 5,652,055, for example, there is described an adhesive sheet (or "bond ply") material suitable to serve as adhesive layers in a variety of adhesive applications, such as in circuit board laminates, multi-chip modules, and in other electrical applications. The adhesive sheet is described as being constructed from an expanded PTFE material, such as that described in U.S. Pat. No. 3,953,566. Preferably, the material is filled with inorganic filler and is constructed as follows: a ceramic filler is incorporated into an aqueous dispersion of dispersion-produced PTFE. The filler in small particle form is ordinarily less than forty microns in size, and preferably less than fifteen microns. The filler is introduced prior to co-coagulation in an amount that will provide ten to sixty percent, and preferably forty to fifty percent by weight filler in the PTFE, in relation to the final resin-impregnated composite. The filled PTFE dispersion is then co-coagulated, usually by rapid stirring. The coagulated filled PTFE is then added. The filled material is then lubricated with a common paste extrusion lubricant, such as mineral spirits or glycols, and then paste extruded. The extrudate is usually calendared, and then rapidly stretched 1.2 to 5000 times, preferably two times to 100 times, per this patent, at a stretch rate of over 10% per second, at a temperature of between 35 degrees C. and 327 degrees C. The lubricant can be removed from the extrudate prior to stretching, if desired. The resulting expanded, porous filled PTFE is then imbibed with adhesive by dipping, calendaring, or using a doctor blade on a varnish solution of about two to seventy percent adhesive in solvent. The wet composite is then affixed to a tenter frame, and subsequently "B-staged" at or about 165 degrees C. for 1 to 3 minutes. The resulting sheet adhesive typically consists of: (a) 9 to 65 weight percent PTFE; (b) 9 to 60 weight percent inorganic filler, in the form of particulate; and (c) 5 to 60 weight percent adhesive imbibed within the porous web structure.

Additional alternative dielectric materials suitable for use in circuitized substrates are described in certain ones of the following listed documents.

With particular respect to many conventional chip carriers, which mount directly onto PCBs, if the coefficient of thermal expansion (CTE) of the semiconductor chip, the organic chip carrier, and the printed circuit board are substantially different from one another, industry standard semiconductor chip array interconnections to the organic chip carrier may be subject to high stress during thermal cycling operation, thus presenting another possible problem to the manufacturer of such substrates. If solder ball connections (e.g., a ball grid array (BGA)) are used, as is well known, the formed solder interconnections between the organic chip carrier and printed circuit board may also be subject to high stress during operation. Significant reliability concerns may then become manifest by failure of the connections or even failure of the integrity of the semiconductor chip (also known as chip "cracking"). These reliability concerns significantly inhibit design flexibility. For example, semiconductor chip sizes may be limited, or interconnect sizes, shapes and spacing may have to be customized beyond industry standards to reduce these stresses. These limitations may limit the electrical performance advantages of the organic electronic package or add significant cost to the carrier-chip(s) electronic package. Typically, a semiconductor chip has a CTE of two-three parts per million per degree Celsius (ppm/.degree. C.) while a standard printed circuit board has a much greater CTE of 17-20 ppm/.degree. C.

Yet another possible concern for the chip carrier manufacturer is one of reliability, involving the surface redistribution layer which interfaces between the organic substrate and the semiconductor chip. This layer may be susceptible to stresses resulting from thermal cycling of the organic substrate together with a chip which is also solder coupled with the organic substrate. Such stresses result from a CTE differential between the surface redistribution layer and the remainder of the organic substrate. The ability of the surface redistribution layer to withstand such stresses depends on mechanical properties of the surface redistribution layer. If the redistribution layer cannot accommodate the thermal stresses, then the surface redistribution layer is also susceptible to deterioration, such as cracking, which can cause failure of interconnections between the carrier and chip, as well as between the carrier and PCB.

In addition to the above many possible concerns, there are environmental and safety concerns to be addressed. Some environmental concerns have arisen of late with respect to the use of halogens (e.g., bromine) and various solder compositions which contain lead as a component thereof. Existing and/or proposed legislation in Europe and Japan, for example, now prohibit such materials. Safety concerns include the flammability of substitute products, meaning the ability of the final product to become inflamed or burn, e.g., due to the presence of excessive heat and/or when operating under extremely high electrical loads. The latter concerns have long been recognized in the industry, which has in turn resulted in many dielectric materials possessing a flame retardant ("FR") rating, e.g., "FR4."

The following listing of patents includes those which describe various dielectric compositions and substrates including same, in addition to methods of making such substrates. The listing is not intended to represent that an exhaustive search of the art has been conducted nor is providing the listing an admission that any are prior art to the presently claimed invention.

In U.S. Pat. No. 7,270,845, there is defined a dielectric composition which forms a dielectric layer usable in circuitized substrates such as PCBs, chip carriers and the like. As such a layer, it includes a cured resin material and a predetermined percentage by weight of particulate fillers, thus not including continuous fibers, semi-continuous fibers or the like as part thereof. U.S. Pat. No. 7,270,845 is assigned to the same Assignee as the present invention.

In U.S. Pat. No. 7,145,221, there is defined a circuitized substrate comprising a first layer comprised of a dielectric material including a low moisture absorptive polymer resin in combination with a nodular fluoropolymer web encased within the resin, the resulting dielectric layer formed from this combination not including continuous or semi-continuous fibers as part thereof. The substrate further includes at least one circuitized layer positioned on the dielectric first layer. An electrical assembly and a method of making the substrate are also provided, as is an information handling system (e.g., computer) incorporating the circuitized substrate of the invention as part thereof. U.S. Pat. No. 7,145,221 is assigned to the same Assignee as the present invention.

In U.S. Pat. No. 7,078,816, there is defined a circuitized substrate comprising a first layer comprised of a dielectric material including a resin material including a predetermined quantity of particles therein and not including continuous fibers, semi-continuous fibers or the like as part thereof, and at least one circuitized layer positioned on the dielectric first layer. An electrical assembly and a method of making the substrate is also provided, as is a circuitized structure including the circuitized substrate in combination with other circuitized substrates having lesser dense thru-hole patterns. An information handling system incorporating the circuitized substrate of the invention as part thereof is also provided. U.S. Pat. No. 7,078,816 is assigned to the same Assignee as the present invention.

In U.S. Pat. No. 6,358,608, there are described various fire retardant and heat resistant yarns, fabrics, felts and other fibrous blends which incorporate high amounts of oxidized polyacrylonitrile fibers. Such yarns, fabrics, felts and other fibrous blends have a superior Limiting Oxygen Index (LOI) and Thermal Protective Performance (TPP) compared to some other fire retardant fabrics. The yarns, fabrics, felts and other fibrous blends is this patent are also described as being more soft and supple, and therefore more comfortable to wear, compared to conventional fire retardant fabrics. The yarns, fabrics, felts and other fibrous blends incorporate up to 99.9% oxidized polyacrylonitrile fibers, together with at least one additional fiber, such as p-aramid, in order to provide increased tensile strength and abrasion.

In U.S. Pat. No. 6,323,436, PCBs are prepared by first impregnating a non-woven aramid chopped fiber mat or a thermoplastic liquid crystalline polymer (LCP) paper instead of the reinforcement typically used in the electronics industry, described in this patent as a woven glass fabric. This aramid reinforcement matte is comprised of a random (in-plane) oriented mat of p-aramid (poly(p-phenylene terephthalamide)) fibers comprised of Kevlar (Kevlar is a registered trademark of E. I. duPont deNemours and Company), and has a dielectric constant of four as compared to 6.1 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about −3 to about −6 ppm/degree Celsius (hereinafter C.) when combined with a thermosetting resin, the final composite described in this patent is said to possess a CTE which can be controlled and adjusted to match that of silicon or semiconductor chips in the range of about 3 to about 10 ppm/degree C. The thermoplastic liquid crystal polymer (LCP) paper is a material called Vecrus (Vecrus is a registered trademark of Hoechst Celanese Corp.), which uses the company's Vectra polymer as part thereof (Vectra also being a registered trademark of Hoechst Celanese Corp.). According to this patent, the paper has a dielectric constant of 3.25, a dissipation factor of 0.024 at sixty Hertz (Hz), a UL 94-V0 rating and an in-plane CTE of less than 10 ppm/degree. C. The alleged advantages of this material over the aramid mat are the lower dielectric constant and very low moisture absorption, allegedly less than 0.02%. The non-woven aramid or LCP paper is used in conjunction with a thermosetting resin to form the final composite substrate. Examples of thermosetting resins useful in this patent include epoxy, cyanate ester, bismaleimide, bismaleimide-triazine, maleimide or combinations thereof. The resin-impregnated low CTE reinforcement is then partially cured to a "B"-stage to form the pre-preg, and then the pre-preg is cut, stacked, and laminated to form a sub-composite with exterior copper sheets.

In U.S. Pat. No. 6,207,595, there is described an example of a dielectric material composition for use in a PCB in which the dielectric layer's fabric material is made from a cloth member having a low enough content of particulates and a sufficient quantity of resin material to completely encase the cloth member including the particulates, so that the resin material extends beyond the highest protrusions of the cloth member (i.e. the fabric material is thicker and will pass a certain test standard (in '595, the known HAST level A test). Thus, the woven cloth is known to include a quantity of particulates, which term is meant in '595 to include dried film, excess coupler, broken filaments, and gross surface debris. The resin may be an epoxy resin such as one often used for "FR4" composites ("FR4" has become a conventional, abbreviated name for the resulting substrates and often also for the resins forming part thereof, and is based in part on the flame retardant (hence the "FR" designation) rating of these established products).

In U.S. Pat. No. 5,418,689, there is described a PCB product wherein the dielectric substrate can include a thermoplastic and/or thermosetting resin. Thermosetting polymeric materials mentioned in this patent include epoxy, phenolic base materials, polyimides and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers.

In U.S. Pat. No. 5,314,742, there is described the use of non-woven aramid sheets to provide reinforcement for the resulting laminate. The reinforcing aramid sheet is described as having a coefficient of thermal expansion (CTE) of less than 10 ppm per .degree. C. and is prepared from 75 to 95 wt. % p-aramid floc and from 5 to 25 wt. % poly(m-phenylene isophthalamide) fibrids. Floc is defined in U.S. Pat. No. 4,729,921. Para-aramid fibers are very high in strength and modulus. Examples of para-aramid fibers are set out in U.S. Pat. No. 3,869,429. Specific examples of para-aramid materials are poly(p-phenylene terephthalamide) (PPD-T) and copoly(p-phenylene-3,4'-oxydiphenylene terephthalamide). Fibers of PPD-T are generally made by an air gap spinning process such as described in U.S. Pat. No. 3,767,756, and are preferably heat treated as described in U.S. Pat. No. 3,869,430. Preferably, poly(p-phenylene terephthalamide) floc which has not been refined is utilized. High shear forces exerted on the fibers during processing, e.g., refining, may cause damage to the fibers and adversely affect the CTE of the reinforcement. It is also preferred to employ p-aramid floc of high orientation and relatively lower crystallinity. Fibrids are described in U.S. Pat. No. 4,729,921. To prepare the sheet, the floc and fibrids are dispersed in the desired proportions as an aqueous slurry, the solids concentration generally ranging between 0.005% and 0.02%. The slurry is not refined. The slurry can be made into paper by conventional means. In the examples mentioned in this patent, wet sheets were formed in an inclined wire Deltaformer papermaking machine and dried using heated drier cans. The dried sheets preferably had a basis weight between 0.8 and 4.0 oz/yd$^2$, and were then calendered between two hard-surface rolls. Calender pressures between about 500 and 2500 kg/cm (nip pressure) and roll temperatures between about 130 and 150 degrees C. were used. The paper was then pre-pregged with a resin having a high glass transition temperature (Tg), e.g., above about 160 degrees C.

In U.S. Pat. No. 5,246,817, there is described one form of improvement in the manufacture of products such as PCBs. The manufacturing process in 5,246,817 consists of the sequential formation of layers using photosensitive dielectric coatings and selective metal deposition procedures. Imaged openings may be formed by exposure of a photosensitive dielectric coating to activating radiation through a mask in an imaged pattern, followed by a described development procedure. Alternatively, imaging may be by laser ablation, in which case, the dielectric material need not be photosensitive.

In U.S. Pat. No. 5,229,199, there is described a rigid composite comprising a polyester, phenolic, or polyamide resin matrix reinforced with woven fabric of continuous p-aramid filaments coated with from about 0.2 to five percent, by weight, of a solid adhesion modifier which reduces the adhesion between said resin matrix and said p-aramid filaments embedded therein, the adhesion modifier selected from the group consisting of a 2-perfluoroalkylethyl ester, a paraffin wax and a combination thereof. The coated filaments, when embedded in the matrix and tested in accordance with MIL-STD-662D, exhibit a ballistics limit from about 1000 to 4000 feet per second and a composite areal density from about 0.4 to six pounds per square foot.

The present invention as defined herein represents an improvement over products and processes such as those described above by the utilization of, among other things, a dielectric layer comprised of a p-aramid base paper impregnated with a low moisture absorption, halogen free resin for use in combination with a circuitized layer to form a circuitized substrate product. Significantly, the product will not include continuous or semi-continuous fiberglass fibers as part thereof. It is believed that such a product and method to make the product, as further defined herein, will represent significant advancements in the art.

OBJECTS AND SUMMARY OF THE INVENTION

It is a primary object of the invention to enhance the art of circuitized substrates.

It is another object of the invention to provide a circuitized substrate including a new dielectric material possessing advantageous features such as reduced flammability, low moisture absorptivity and free of halogens.

It is another object to provide a method of making such a circuitized substrate which is adaptable to current manufacturing procedures, utilizes the new dielectric material defined herein.

According to one embodiment of the invention, there is provided circuitized substrate comprising a dielectric layer including a p-aramid paper impregnated with a halogen-free, low moisture absorptivity resin and not including continuous or semi-continuous fiberglass fibers as part thereof and a first circuitized layer positioned on the dielectric layer.

According to another embodiment of the invention, there is provided a method of making a circuitized substrate which comprises providing a p-aramid paper, impregnating the p-aramid paper with a halogen-free, low moisture absorptivity resin to form a dielectric layer not including continuous or semi-continuous fiberglass fibers as part thereof and thereafter forming a first circuitized layer on the dielectric layer.

BEST MODE FOR CARRYING OUT THE INVENTION

For a better understanding of the present invention, together with other and further objects, advantages and capabilities thereof, reference is made to the following disclosure and appended claims in connection with the above-described drawings. Like figure numbers will be used from figure to figure to identify like elements in these drawings.

By the term "circuitized substrate" as used herein is meant to include substrates having at least one (and preferably more) dielectric layer(s) of the new material defined herein and at least one (and preferably more) metal electrically conductive layer(s). It is believed that the teachings of the instant invention are also applicable to what are known as "flex" circuits.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface and/or to internal circuitry using one or more thru-holes. Perhaps the most well known such assembly is the conventional printed circuit board (PCB) typically having several such external electrical components thereon (including possibly one or more chip carriers) and coupled to the internal circuitry of the PCB and/or each other.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system which the substrate forms part of.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

By the term "p-aramid" as used herein is meant a para-aromatic polyamide of which the polymeric main chain is composed wholly or for the most part of aromatic nuclei, such as phenylene, biphenylene, biphenyl ether, naphthylene, and the like, which are interconnected wholly or for the most part via the para-position (1,4-phenylene) or a comparable position (e.g., 2,6-naphthylene). Preferably, the aromatic nuclei are phenylene groups, more preferably, the polymer is PPTA. PPTA can be prepared in a known manner by the reaction in an appropriate solvent (notably $CaCl_2$-containing N-methylpyrrolidone) of stoichiometric amounts of para-phenylene diamine (PPD) and terephthalic acid dichloride (TDC).

By the term "thru-hole" as used herein is meant to include what are also commonly referred to in the industry as "blind vias" which are openings typically from one surface of a substrate to a predetermined distance therein, "internal vias" which are openings located internally of the substrate and are typically formed within one or more internal layers prior to lamination thereof to other layers to form the ultimate structure, and "plated through holes" (also known as PTHs), which are openings which typically extend through the entire thickness of a substrate. All of these various openings form electrical paths through the substrate and often include one or more conductive layers, e.g., plated copper, thereon. These openings are formed typically using mechanical drilling or laser ablation.

As mentioned, the present invention involves the utilization of a dielectric layer comprised of a p-aramid base paper and a low-moisture absorption, halogen-free resin for a circuitized substrate product. Use of aramid fiber materials is known for such molded items as speaker cones and parts having good acoustical properties. Aramid fiber material for speaker cones generally combine crystallized p-aramid fibers and amorphous m-aramid fibrids, the fibrids acting as a binder for the p-aramid fibers by softening and bonding the fibers when the formed sheets are subjected to high pressure and temperature. Such aramid fiber papers typically have coloring similar to that of the base fiber. Generally, papers made from natural colored p-aramid fiber, such as the fiber known under the E. I. duPont deNemours and Company (DuPont) trademark KEVLAR, range in color from golden to cream-beige. Papers made from natural colored m-aramid fiber, such as the fiber known under the duPont trademark NOMEX, range in color from off-white to light beige. The p-aramid fiber-containing KEVLAR is also known for its good fire retardant properties, as are other p-aramid materials. U.S. Pat. No. 6,358,608, cited above, represents use of p-aramid fibers for use in clothing which provides such properties. Use of p-aramid fibers is also known in the formation of impact-resistant clothing, e.g., for police officers, wherein the fibers are used in combination with a suitable resin. U.S. Pat. No. 5,229,199, mentioned above, is one example of this. Still, further, use of p-aramid fibers is known in other products such as asbestos replacement items (e.g. braking pads), hot air filtration fabrics, tires, ropes and cables, optical fiber cable systems, sail cloth, sporting goods, drumheads, wind instrument reeds, boat hull material, reinforced thermoplastic pipes and tennis strings.

As understood from the following, a key attribute of the present invention is the utilization of a dielectric material as part of the substrate which enables the provision of high density arrays of thru-holes within the substrate while substantially preventing electrical shorting or the like between closely spaced, adjacent holes. That is, very highly dense concentrations of relatively narrow (in diameter) thru-holes are capable of being provided in this unique dielectric layer taught herein which can then be rendered conductive (typically, plated) to provide highly dense circuit connections between designated conductive layers (e.g., signal, power and/or ground) within the final structure incorporating the circuitized substrate. Most significantly, this new dielectric material is of a base material (p-aramid) impregnated with a suitable resin so as to assure reduced flammability for the final substrate in addition to low moisture absorptivity and other advantageous features defined herein. Surprisingly, the material, although including p-aramid fibers from the paper used, overcomes the aforementioned disadvantages associated with woven or non-woven fiberglass reinforcement materials.

As explained, use of fiberglass fibers as defined above is often deleterious when producing substrates during the hole-forming and plating stages because of fiber intrusion within the holes which can form a base for a conductive path to adjacent conductive holes. The dielectric material as taught herein, although containing p-aramid fibers, is substantially able to overcome such disadvantages while assuring a product which is capable of containing high density patterns of thru-holes and thus improved operational capabilities compared to many prior art products. As mentioned, the new dielectric material of the invention possesses low moisture absorption properties which are extremely beneficial because it provides for ease of processing (including during lamination when temperatures may exceed 245 deg. C.) and a highly desirable low dielectric constant (advantageous for the reasons cited above). Layers including this material possess sufficient strength and durability to withstand the rigors, particularly the high temperatures and pressures, associated with lamination as conventionally utilized in the manufacture of PCBs, and in particular producing such PCBs having several dielectric and conductive layers bonded together.

As stated, the dielectric material used to form the dielectric layer for the circuitized substrate of the various embodiments of the invention defined herein is in the form of a p-aramid base paper member, preferably where the p-aramid material comprises substantially one-hundred percent of the base member. The p-aramid fibers of such paper are very short and randomly oriented in the x-y plane of the material sheet, which enables these fibers to overcome the above problems associated with the typically longer and larger (in diameter) fiberglass fibers, especially when used in a continuous orientation traversing the full width and/or length of the substrate.

The resulting layer will thus possess the several features cited above which known p-aramid-containing products provide, such as reduced flammability, robustness, etc. The p-aramid paper is impregnated with a low moisture absorptivity resin (one example being described in greater detail below), preferably a high Tg (glass transition temperature) thermosetting polymer resin which, in one embodiment, has less than 0.5 percent moisture absorption when the formed dielectric layer is immersed in water for a period of about 24 hours at a temperature of about 22° C. In this one embodiment, the resin of the formed layer comprises from about 10 to about 80 percent by weight of the layer. Most importantly, the formed layer does not include fiberglass materials, as mentioned above.

The overall thickness for the resin-p-aramid paper layer may have a thickness within the range of only from about twenty-five microns to about 150 microns, thereby illustrating the extreme thinness of the final layer, a highly desirable feature when attempting to meet many of today's demanding miniaturization requirements. Not having fiberglass strands as part thereof, the coefficient of thermal expansion (CTE) of the formed dielectric layer may be from about ten to about twenty-five parts per million (ppm) per degree C. in both x and y directions. As will be shown in the drawings, the formed dielectric layer (and other layers if bonded thereto to form a thicker substrate having many layers) is capable of including a plurality of thru-holes therein, in patterns having densities of as much as 5,000 to about 10,000 holes per square inch of the dielectric area.

Dielectric layers produced using the p-aramid and resin materials defined herein possess the following key electrical, thermal, physical and thermal expansion properties, as defined by process development analyses. These properties are:

| Electrical Properties | |
|---|---|
| Dielectric constant (Dk) at 1-2.5 GHz | 3.4 |
| Loss factor at 1 MHz | 0.016 |

| Thermal Properties | |
|---|---|
| Tg (DSC mid point) (deg. C.) | 180 |
| Tg (TMA) (deg. C.) | 170 |
| Decomposition Temperature (deg. C.) | 330 |

| Thermal Expansion | |
|---|---|
| Below Tg (ppm/deg. C.) | 15 |
| Above Tg (ppm/deg. C.) | 7 |

| Physical Properties | |
|---|---|
| % moisture, after 24 hours | 0.44 |
| % moisture, after 1 hour (pressure cooker conditions - 121 deg. C./100% relative humidity) | 0.8 |
| Elongation (%) | 2.5 |

The resulting dielectric layer has low moisture absorptivity (less than about 0.5% moisture absorption after being immersed for 24 hours in water at 22° C. (room temperature)) and makes it very unique as a substrate for building PCBs and chip carriers. Equally important, this layer and additional similar layers, when staged as defined, are then readily receptive to subsequent circuitization processing using conventional photolithographic processing. In a preferred embodiment, the desired circuitry is formed of copper and applied using such processing. Photolithographic processing of substrates of this type is well known in the PCB field and further description is not deemed necessary.

It has been discovered that when drilling (e.g., typically using a laser, described below) thru-holes in the above dielectric, the aforementioned highly dense concentrations of thru-hole patterns are attainable without, surprisingly, electrical shorting of the holes after plating of the sidewalls thereof has occurred. That is, the plating material (typically copper) does not migrate from thru-hole to thru-hole, as occurred above when continuous and/or semi-continuous fiberglass materials were utilized in earlier dielectric compositions, especially when in the continuous format. In one embodiment of the invention, it was possible to drill a total of up to about 10,000 holes within one square inch of dielectric layer, representing an extreme example of the high density hole patterns attainable using the unique teachings herein. Pattern densities ranging from about 5000 holes per square inch to about 10,000 holes per square inch are attainable using the present invention's teachings. As stated, a laser is preferably used for such drilling, and in particular, a YAG laser, which may operate at speeds of 20-50 thru-holes per second, each hole having a less than two mil diameter and extending through the dielectric layer. This laser is also capable of providing up to 250 thru-holes per second with the resulting holes having similar diameters but extending only partly into the dielectric layer (also referred to as "blind vias" as mentioned above).

One particular use for the circuitized substrate formed herein is as part of a chip carrier or a PCB or other electronic packaging product such as those made and sold by the Assignee of the instant invention. One particular example is a chip carrier sold under the name HyperBGA chip carrier (HyperBGA being a registered trademark of the Assignee, Endicott Interconnect Technologies, Inc.). The invention is of course not limited to chip carriers or even to higher level PCBs. It is also understood that more than one such circuitized substrates (e.g., those each also referred to as a "core", a specific example being what is referred to as a "power core" if the core includes one or more power planes and is thus to serve primarily in this capacity) may be incorporated within such a carrier or PCB, depending on operational requirements desired for the final product. As defined below, the "core" can be readily "stacked up" with other layers, including conductors and dielectric, and bonded together (preferably using conventional PCB lamination processing) to form a much thicker, multilayered carrier or multilayered PCB. The laminate so formed is then subjected to further processing, including conventional photolithographic processing to form circuit patterns on the outer conductive layers thereof. As described herein-below, such external patterns can include conductive pads on which conductors such as solder balls can be positioned to connect the structure to other components such as semiconductor chips, PCBs and chip carriers if so desired. The unique teachings of this invention are thus adaptable to a multitude of electronic packaging products. Significantly, the invention enables incorporation of the circuitized substrate (e.g., if a dense "core") with its highly dense thru-hole patterns and interconnection capabilities within a larger multilayered structure in which the other layered portions do not possess such densification and operational capabilities. Thus, a "standard" multilayered product can be produced for most of its structure and the unique subcomponent taught herein simply added in as part of the conventional processing of such a "standard". If the circuitized substrate core is internally positioned, it enables highly dense connections between other, less dense portions of the multilayered product, thus giving said product the unique capabilities of the invention in at least a portion thereof.

Figure 1:
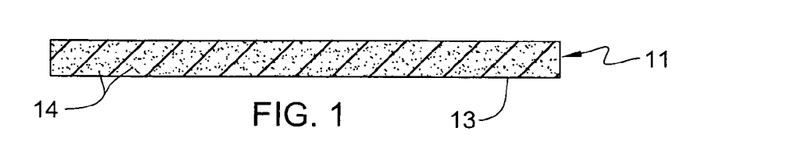
FIGS. 1-6 represent steps utilized to produce a circuitized substrate in accordance with one embodiment of the invention.

In FIG. 1, there is shown a first step in making a p-aramid base member 11 according to one embodiment of this invention. Member 11 is formed by first providing a layer 13 of p-aramid paper, preferably comprised of one of the above p-aramid materials but which may be of other p-aramid materials known in the art. The p-aramid material comprises one-hundred percent of the paper. In one example, the paper is made primarily from p-aramid fibers of various lengths and diameters and a certain quantity of pulp which is again based on p-aramid composition. Further, it is made in a way that has side fibrids, which are like branches to assist in holding the fibers and pulp together with the fibers randomly oriented in the x-y plane. The paper in this form may be made to a thickness of from a little as about one mil (a mil being one-thousandths of an inch) up to about six mils. In this particular example, the paper has a thickness of 3.6 mils. Such a paper is available from Hollingsworth & Vose Company, having a business location in East Walpole, Mass.

Layer 13 is now impregnated with a particular low moisture resin 14. The preferred resin material for this use is one with a high glass transition temperature, is halogen-free, and one which possesses a high decomposition temperature. In one embodiment, (in which there in no inorganic particulate filler added), the resin composition preferably comprises: (1) from about thirty-five percent to about forty-two percent of Mitsubishi 2060B BT resin, (including seventy percent solids in methyl ethyl ketone, and available from Mitsubishi Chemicals, Inc.); (2) from about three percent to about ten percent "Tactix 756" resin (a dicyclopentadiene-containing polyepoxide resin, available from Huntsman Chemical), at one hundred percent solids; (3) from about ten percent to about twenty-seven percent "Exolit OP 930" retardant (a halogen-free flame retardant with a high phosphorus content suitable for use in both thermoplastic and thermoset applications, provided in the form of a white, fine-grained powder, and is available from Clariant Corporation, Pigments and Additives Division); (4) from about nine percent to about fifteen percent "PKHS-40" resin, a high molecular weight, reactive thermoplastic resin available from InChem Corporation in Rock Hill, S.C. at forty percent solids in methyl ethyl ketone; (5) from about 0.025 to about 0.075 percent manganese octoate at six percent solids in mineral spirits; (6) from about twenty percent to about forty percent methyl ethyl ketone; and (7) from about zero percent to about one percent Dow-Corning Z-6040, an epoxy functionality silane coupling agent available form Dow-Corning, of Midland Minn.). All percents above are by weight of the complete composition.

It is also possible for layer 13 to be impregnated with a resin containing an inorganic particulate filler, which resin preferably also includes low moisture, high glass transition, halogen-free and high decomposition temperature properties. In this embodiment, the inorganic filler comprises from about fifteen to about twenty percent. The resin composition is comprised of (1) from about twenty-nine percent to about thirty-six percent Mitsubishi 2060B BT resin (seventy percent solids in methyl ethyl ketone); (2) from about three percent to about ten percent "Tactix 756" resin (at one hundred percent solids); (3) from about nine percent to about twenty-seven percent "Exolit OP 930" retardant; (4) from about six percent to about twelve percent "PKHS-40" resin at forty percent solids in methyl ethyl ketone; (5) from about 0.025 to about 0.075 percent manganese octoate at six percent solids in mineral spirits; (6) and from about twenty percent to about fifty percent methyl ethyl ketone; and (7) from about 0 percent to about one percent Dow-Corning Z-6040 silane coupling agent. All percents above are by weight of the total composition.

Impregnation may be accomplished using conventional vertical treating. The p-aramid paper is dipped into a solvent-carried resin solution, and then dried in a vertical air convection or infrared oven. Impregnation occurs until the paper base is saturated with the above first identified embodiment resin composition (having no inorganic particulate filler added) to approximately sixty-four percent by weight of the final resin-paper member 11. In one version of this particular embodiment, the resin may form about 63.4 to about 65.4 percent by weight of the final resin-paper member. In the case of when the composition of the second embodiment above (inorganic particulate filler is added), the paper is saturated with this composition to approximately sixty-four percent by weight of the final resin-paper member. As with the first embodiment, this second resin may form about 63.4 to about 65.4 percent by weight of the final resin-paper member.

Member 11 is now subjected to heat at a temperature of from about 120 to degrees Celsius (C.) to about 150 degrees C., sufficient to drive off (remove) any unwanted solvents and/or significantly, to advance the 'stage' of the resin. In one embodiment, the resin now is at a "B-stage" cure, meaning it is not yet fully cured but workable in sheet form so that it may be aligned and stacked with other layers such as is needed in lamination processing.

Heat is preferably applied by placing member 11 in a convection oven for a period of from about two to five minutes. It is possible to heat member 11 other ways, including, e.g., infrared radiation. As mentioned, the heat level should be sufficient to drive off undesirable solvents and also to increase the resin cure stage, but not to fully cure the resin. The defined temperature range and time period is not limiting of the invention, as these are dependent on resin material saturation, member 11 thickness, catalyst levels and other possible factors. Member 11 is now allowed to cool, e.g., by placing the member at room temperature for a period of from about one minute to about two minutes. It is then ready for further processing, including cutting it into desired lengths and widths, depending on the respective substrate dimensions into which the member is being incorporated. In one example, member 11 is of a rectangular sheet-like configuration having length and width dimensions of 51 centimeters and 66 centimeters, respectively.

Significantly, the resulting dielectric member 11 is a thin layer adapted for being aligned with and bonded to other dielectric and conductive layers to form a larger multilayered substrate such as a chip carrier or PCB. By the term "thin" as used to define the thickness of this layer is meant a thickness of no greater than six mils (six thousandths) and preferably less. Layers as thin as only about 1.4 mils may be successfully produced using the teachings of this invention and utilized within larger substrate products. Such "thinness" represents a significant feature of the invention for, among others, the reasons stated hereinabove.

Figure 2:
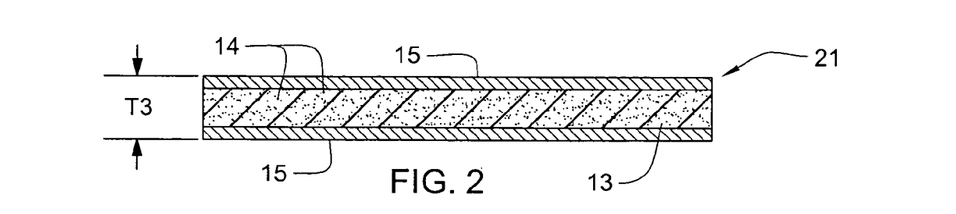

In FIG. 2, outer conductive layers 15 are next applied to the now-cooled interim member 11 using conventional PCB lamination processing. In one example, each layer is comprised of copper or copper alloy and has a thickness of only 0.46 mils. When aligned on opposite sides of member 11, a total pressure of about 400 pounds per square inch (psi) was used, at a temperature of about 188 deg. C., for a period of about 90 minutes. The result is a laminated structure 21 having outer conductive layers 15 each of substantially the same thickness as above but a common interim dielectric layer 13 now having a compressed thickness of only about 4.5 mils, giving the overall final structure a thickness (T3) of less than six mils, and in this particular embodiment about 5.92 mils. The FIG. 2 structure, with layer 13 and the two outer conductive layers 15, may now serve as the first part of the larger structure for the circuitized substrate defined herein, which, as also defined, may serve as a "core" substrate for a thicker, multilayered product such as a PCB or chip carrier. In the broadest sense, however, it is understood that the structure 21, if one or both of the outer layers 15 are "circuitized" (e.g., patterned to include a desired circuit pattern), may itself function as a circuitized substrate.

Figure 3:
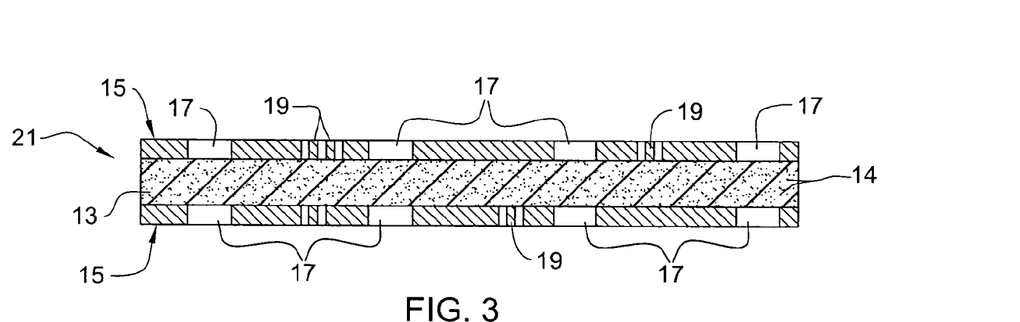

In FIG. 3, structure 21 (now shown on a larger scale than in FIGS. 1 and 2 for enhanced illustration purposes) is now subjected to conventional photolithographic processing in which outer conductive layers 15 are "circuitized." That is, layers 15 are processed using known processing to form a desired pattern thereon. This pattern will include, at a minimum, several openings 17 in each layer which are aligned opposite each other as shown. In addition, it is also within the scope of the invention to provide additional circuit features such a lines and/or pads 19 within one or both layers. If structure 21 is to eventually serve as part of a "power core", layers 15 will typically only include openings 19 therein or, may not include any openings but instead be in solid form. However, if one or both layers 15 are to function in another capacity, e.g., as a signal layer, then patterns are provided. The patterns in FIG. 3 (and FIGS. 4-6) are thus not meant to limit the scope of the invention.

Figure 4:
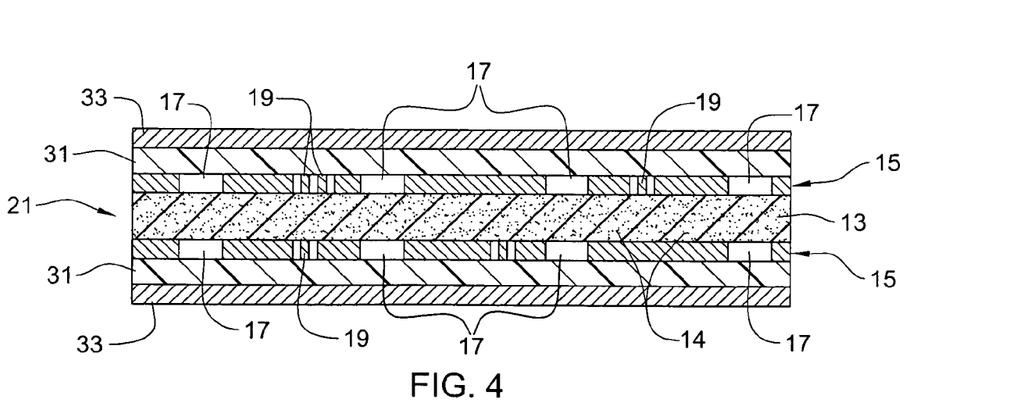
Figure 5:
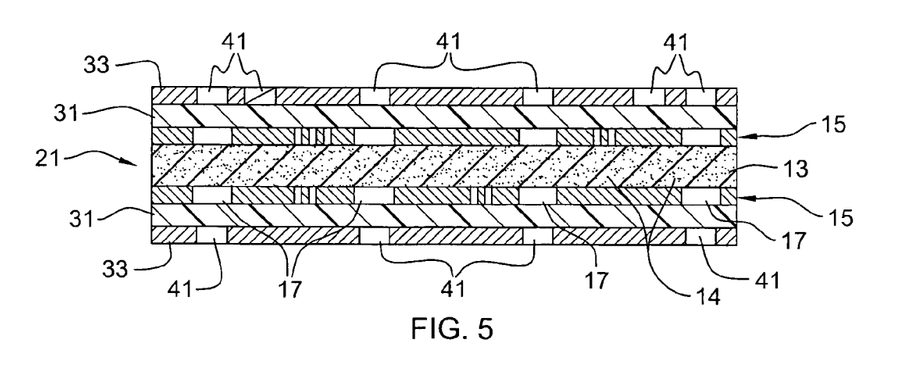
Figure 6:
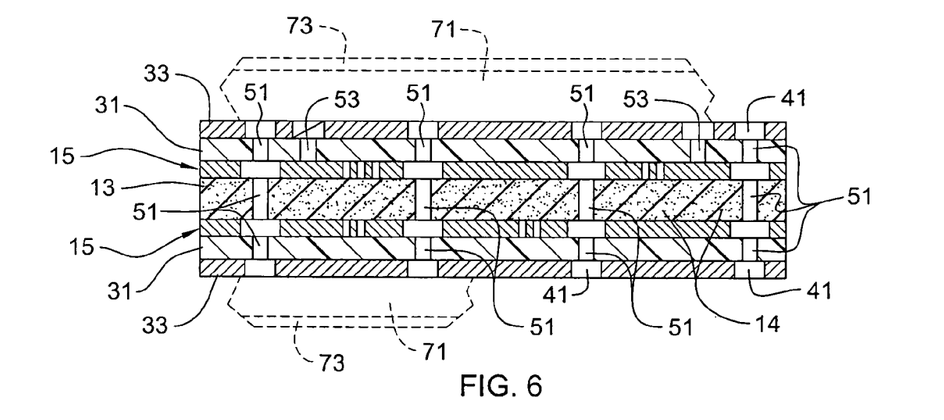

In FIG. 4, structure 21 is shown to include an additional layer 31 of dielectric material on both opposite sides of the structure. Each layer 31 may be of a low moisture absorptivity resin, also having no continuous or semi-continuous fiberglass fibers, including one of the above two. These layers 31, if of such material, will thus serve as low moisture absorption and low thermal expansion layers on opposite sides of structure 21. As shown, each layer 31 preferably includes a thin conductive (e.g., copper) layer 33 thereon. In one example of the invention, layers 31 and 33 are each comprised of the same thicknesses as layers 13 and 15 in FIG. 1 and are laminated onto structure 21 using lamination processes known in the art, including one using the same parameters defined above for structure 21. Following lamination, each of the conductive layers 33 is "personalized" to include a plurality of openings 41 therein which align with respective ones of the openings 17 in the conductive layers 15 located adjacent thereto (but separated by the interim layer 31), as seen in FIG. 5. It is noteworthy that at least one opening 41 is aligned with a corresponding opening 17, but that other, perhaps smaller openings 41 may also be provided which are not so aligned, but instead align with other portions of the circuit formed on layer 15 (if one has been so formed). With openings 41 formed, thru-holes 51 are drilled within the FIG. 5 structure using a YAG laser as defined above. The laser drills thru-holes through the entire thickness of the FIG. 5 structure wherever paired, aligned openings 17 and corresponding aligned openings 41 are present, as seen in FIG. 6. In one embodiment, a total of as many as 10,000 holes, each having a diameter of only about two mils, may be provided in each square inch of the structure in these aligned orientations. This represents, again, the highly dense patterns attainable using the teachings of this invention.

In addition to the highly dense pattern of thru-holes 51 which extend through the entire thickness of the FIG. 5 structure, as seen in FIG. 6, lesser depth thru-holes 53 (also referred to by some in the art as "blind vias") may also be formed simultaneously with the formation of holes 51 to reach only a conductive layer 15. The purpose of these latter holes is to eventually form an electrical connection between conductive layer 33 and layer 15 (e.g., from selected signal lines on one to lines on another, again assuming layer 15 is to function as a signal carrying conductive plane), adding greater versatility to the invention if so used. One or both layers 15 could also serve as a ground layer and thus provide grounding or power distribution functions, if so desired. It is understood that thru-holes 51 and 53 (if used) are then to be plated with conductive material, a preferred material being copper having a thickness of only about 0.2 mils to about one mil. The preferred plating processes for these and the other thru-holes described herein may be either electrolytic or electro-less plating. Electrolytic and electro-less plating of thru-holes is well known in the art so further description is not deemed necessary.

The structure shown in FIG. 6 may also now be referred to as a circuitized substrate and may serve as a stand alone substrate, e.g., a chip carrier, or, as mentioned, as a "core" structure to be used in combination with other conductive and dielectric layers, including with other similar circuitized substrates, in a larger, multilayered structure.

In FIG. 6, there is shown the addition of such another dielectric layer 71 (in phantom) on opposite sides of the structure formed with thru-holes therein, and an additional conductive layer 73 (also in phantom) on each of the dielectric layers. This drawing FIG. is intended to represent the fact that several additional dielectric and conductive layers may be added to the FIG. 6 structure to form a thicker multilayered final product such as a PCB or laminate chip carrier having more than the number of layers shown in FIGS. 3-6. As stated, it is also possible to incorporate more than one such internal circuitized substrate "core" such as shown in FIG. 6 within such a larger, thicker structure to thus afford the final structure with the teachings of the invention at more than one location therein. To this end, the embodiment of FIG. 5, as also stated, can also be considered such a "core." Finally, it is also within the scope of the invention to utilize all of the FIG. 4 structures only, to form a multilayered composite, utilizing known "sticker sheet" dielectric layers between each aligned pair during lamination thereof into the final structure. Whichever the choice, the thru-holes in each of the dielectric-conductive sub-composites (such as that shown in FIG. 4) will be interconnected electrically, thereby providing conductive paths through selected portions of the final structure, including through the entire structure itself, if desired. If, for example, three sub-composites of the type shown herein are combined to form a multilayered final structure (e.g., a multilayered PCB), then it is clear that the thru-holes of the interim sub-composite will provide electrical interconnection, once rendered conductive such as by the afore-defined plating operation, between the thru-holes of the two outer sub-composites bonded on opposite sides of this interim sub-composite.

Figure 7:
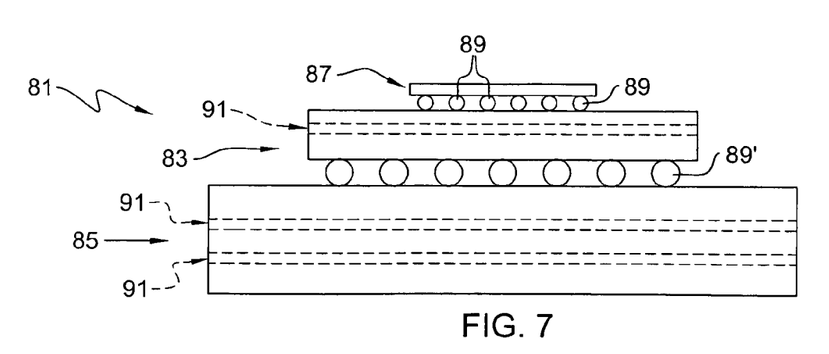
FIG. 7, on a much smaller scale than FIGS. 1-6, illustrates an electrical assembly which may utilize one or more of the circuitized substrates defined herein and made in accordance with the teachings herein.
Figure 8:
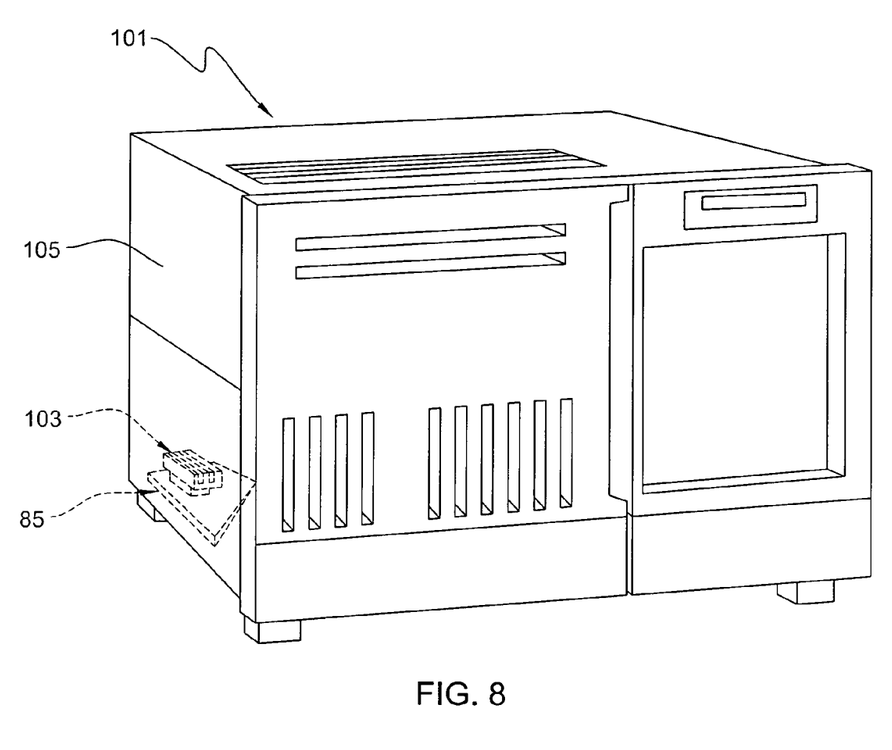
FIG. 8 represents an information handling system according to one aspect of the invention which is capable of utilizing one or more of the circuitized substrates taught herein.

FIG. 7 represents one example of an electrical assembly 81 that may be formed using the circuitized substrates taught herein. As stated, each substrate so formed in accordance with the teachings herein may be utilized within a larger substrate of known type such as a PCB, chip carrier or the like. FIG. 7 illustrates two of these larger components, one being a chip carrier 83 and the other a PCB 85. PCB 85 is positioned within and electrically coupled to an electronic assembly such as an information handling system as shown in FIG. 8, which may be in the form of a personal computer, mainframe, computer server, etc. Chip carrier 83, as shown, is typically positioned on and electrically coupled to an underlying substrate such as PCB 85. Such a carrier also typically has a semiconductor chip 87 mounted thereon and also electrically coupled to the carrier. In the embodiment of FIG. 7, the connections between chip and carrier and between carrier and PCB are accomplished using solder balls 89 and 89', respectively. Such connections are known in the art and further description is not considered necessary. The significance of FIG. 7 is to show the use of one or more of the circuitized substrates 91 (in phantom) of the invention in the chip carrier 83 and PCB 85, thus forming part thereof. Two substrates 91 are shown as used within PCB 85, while only one is shown within carrier 83. As mentioned above, the invention is not limited to the numbers shown. For example, three or more substrates 91, each forming a particular circuitized "core" (e.g., a "power core") within the PCB, may be utilized to afford the PCB the highly advantageous teachings of the invention. Or, as stated, the entire PCB or chip carrier laminate may be comprised of dielectric layers as taught here.

In FIG. 8, there is shown an information handling system 101 in accordance with one embodiment of the invention. System 101 may comprise a personal computer, mainframe computer, computer server, or the like, several types of which are well known in the art. System 101, as taught herein, may include the electrical assemblies as shown in FIG. 7, including both PCB 85 and carrier 83, these being represented by the numeral 103 in FIG. 8. This completed assembly, shown hidden, may be mounted on still a larger PCB or other substrate (not shown), one example being a "motherboard" of much larger size, should such a board be required. These components are shown hidden because these are enclosed within and thus behind a suitable housing 105 designed to accommodate the various electrical and other components which form part of system 101. PCB 85 may instead comprise such a "motherboard" in system 101 and thus include additional electrical assemblies, including additional printed circuit "cards" mounted thereon, such additional "cards" in turn also possibly including additional electronic components as part thereof. It is thus seen and understood that the electrical assemblies made in accordance with the unique teachings herein may be utilized in several various structures as part of a much larger system, such as information handling system 101. Further description is not believed necessary.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A circuitized substrate comprising:
   a dielectric layer no greater than 0.1524 mm thick including a p-aramid paper impregnated with a halogen-free, low moisture absorptivity resin having less than about 0.5 percent moisture absorption when immersed in water for a period of about 24 hours at a temperature of about 22°C., and not including continuous or semi-continuous fiberglass fibers for facilitating subsequent laser-drilled thru-holes as part thereof to form a fire resistant dielectric layer; and a first circuitized layer positioned on said dielectric layer.

2. The circuitized substrate of claim 1 wherein said low moisture absorptivity resin of said dielectric layer comprises a high Tg polymer.

3. The circuitized substrate of claim 1 wherein said dielectric layer has a coefficient of thermal expansion in the x and y direction less than about 23 parts per million/degree C.

4. The circuitized substrate of claim 1 wherein said dielectric layer includes a plurality of thru-holes therein, said thru-holes being in a pattern having a density of from about 5,000 thru-holes per square inch to about 10,000 thru-holes per square inch.

5. The circuitized substrate of claim 1 wherein said first circuitized layer comprises copper.

6. The circuitized substrate of claim 1 further including a second circuitized layer positioned on said dielectric layer on a side opposite said first circuitized layer.

7. The circuitized substrate of claim 6 further including second and third dielectric layers positioned on said first circuitized layer and said second circuitized layer, respectively, and third and fourth circuitized layers formed on said second and third dielectric layers, respectively.

8. The invention of claim 7 wherein said circuitized substrate comprises a chip carrier.

9. The circuitized substrate of claim 1 further including at least one electrical component positioned on and electrically coupled to said circuitized substrate, said substrate and said component being an electrical assembly.

10. The circuitized substrate of claim 9 wherein said electrical component comprises a semiconductor chip.

11. The circuitized substrate of claim 9 wherein said electrical component comprises a chip carrier.

12. The circuitized substrate of claim 1 wherein said halogen-free, low moisture absorptivity resin includes an inorganic particulate filler.

13. The circuitized substrate of claim 1 wherein said halogen-free, low moisture absorptivity resin does not include an inorganic particulate filler.

* * * * *